United States Patent
Suzuki et al.

(10) Patent No.: US 6,447,888 B2
(45) Date of Patent: Sep. 10, 2002

(54) CERAMIC WIRING BOARD

(75) Inventors: Shinichi Suzuki; Kenichi Nagae; Yoshihiro Nakao; Masanari Kokubu; Masahiko Higashi, all of Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/773,161

(22) Filed: Jan. 30, 2001

(30) Foreign Application Priority Data

| Jan. 31, 2000 | (JP) | 2000-027280 |
| May 31, 2000 | (JP) | 2000-161605 |
| Jun. 29, 2000 | (JP) | 2000-197267 |
| Jul. 31, 2000 | (JP) | 2000-230909 |
| Aug. 30, 2000 | (JP) | 2000-261743 |

(51) Int. Cl.$^7$ ................................. B32B 3/00
(52) U.S. Cl. ............. 428/210; 174/258; 252/62.3 BT; 361/321; 501/32
(58) Field of Search ............. 428/210; 501/137, 501/136, 32; 174/250, 258; 361/320, 321.5; 252/62.3 BT

(56) References Cited

U.S. PATENT DOCUMENTS

| 3,622,358 A | * | 11/1971 | Yoshioka et al. | 106/39 R |
| 3,660,124 A | * | 5/1972 | Yoshioka et al. | 252/520.21 |
| 3,732,117 A | * | 5/1973 | Nitta et al. | 501/137 |
| 5,065,275 A | * | 11/1991 | Fujisaki et al. | 361/321 |
| 5,672,378 A | * | 9/1997 | Maher et al. | 427/123 |

* cited by examiner

Primary Examiner—Cathy Lam
(74) Attorney, Agent, or Firm—Hogan & Hartson, LLP

(57) ABSTRACT

A ceramic wiring board provided with an insulating layer of a high dielectric constant formed of a ceramic sintered product having a high dielectric constants wherein the ceramic sintered product contains a crystal phase of lanthanum titanate and a glass phase present on the grain boundaries of the crystal phase, and has a coefficient of thermal expansion at 40 to 400° C. of not smaller than $8 \times 10^{-6}$/° C. and a specific inductive capacity at 1 MHz of not smaller than 10. The wiring board contains a capacitor and is very useful in realizing various electric circuit devices in small sizes, and can be further reliably mounted on a printed board that uses an organic resin as an insulating material.

20 Claims, 1 Drawing Sheet

CERAMIC WIRING BOARD

BACKGROUND OF THE INVENTION

1. Field of the Invention

The present invention relates to a ceramic wiring board equipped with an insulating layer of a high dielectric constant formed of a sintered product of ceramics heaving a high dielectric constant.

2. Description of the Prior Art

A ceramic wiring board used for a package for accommodating semiconductor devices such as LISS is provided with an insulating substrate formed by laminating, in many layers, insulating layers of ceramics such as alumina or mullite, and a metallized wiring layer is arranged on the surface of the insulating substrate or inside therein. In recent years, there has been put into practice a ceramic wiring board forming an insulating substrate by using glass ceramics that can be co-fired with the copper metallize.

In the ceramic wiring board, the number of connection terminals connected to an external circuit board such as printed board tends to increase with an increase in the degree of integration of the semiconductor devices. A ball grid array (BGA) having spherical connection terminals of a solder attached to the lower surface of a ceramic wiring board has been known to be capable of providing the greatest number of connection terminals without increasing the size of the wiring board. In this ball grid array (BGA), the connection terminals are placed and contacted to the wiring conductors formed on an external electric circuit board and are heated at a temperature of 250 to 400° C. so as to melt and connect the connection terminals to the wiring conductors, in order to mount a ceramic wiring board on the external electric circuit board.

Here, the insulating substrate (ceramic wiring board) formed of ceramics such as alumina or mullite has a coefficient of thermal expansion of about 4 to $7 \times 10^{-6}/°$ C. whereas the printed board on which the ceramic wiring board is mounted is, usually, formed of glass-epoxy insulating layer having a coefficient of thermal expansion of about 11 to $18 \times 10^{-6}/°$ C. That is, there exists a large difference in the coefficient of thermal expansion between the external circuit board and the ceramic wiring board. In the mounting structure using the above ball grid array (BGA), therefore, a large thermal stress is generated between the two due to the difference in the coefficient of thermal expansion as heat is generated by the operation of the semiconductor devices. Besides, the effect of this thermal stress increases with an increase in the number of the connection terminals; i.e., the thermal stress is applied to the connection terminals as the operation and stop of the semiconductor devices are repeated, causing the connection terminals to be peeled off the wiring conductors.

Accompanying a rapidly spread use of portable data terminals such as cell phones and notebook personal computers on the other hand, it has been strongly demanded to fabricate electronic parts incorporated therein in small sizes. For example, a switching circuit and a power amplifier circuit of a cell phone are constituted by plural resistors and capacitors that have heretofore been individually placed on the electric circuit board hindering the attempt for decreasing the size and for decreasing the cost of production.

In order to fabricate, in small sizes, the electronic parts incorporated in the portable electronic devices, it is necessary to decrease the size of not only the ceramic wiring hoard for accommodating the semiconductor devices but also of the external circuit board ducts as a printed board for mounting the wiring board. So far, however, the ceramics wiring hoard, capacitor devices and resistor devices have been separately mounted on an external circuit board, making it difficult to decrease the size and driving up the cost for mounting.

Therefore, there has been proposed a capacitor-incorporated board by arranging an insulating layer of a high dielectric constant formed of ceramics having a high dielectric constant inside the ceramic wiring board. However, a composite perovskite dielectric material comprising chiefly $BaO-TiO_2$ or $PbO-TiO_2$ which has been known as ceramics having a high dielectric constant, cannot be co-fired with the glass ceramics, and is not suited for the production of a ceramic wiring board having a large coefficient of thermal expansion. Thus, it is very difficult to produce the ceramic wiring board having a small difference of thermal expansion from the external circuit board such as printed board, by using the composite perovskite dielectric material.

In view of the above-mentioned problems, the present applicant has previously proposed a glass ceramic sintered product of high thermal expansion having a high dielectric constant by sintering a glass component of a high thermal expansion and a filler component such as $BaTiO_3$ or $CaTiO_3$. That is, the filler component can be co-fired with the glass component. By using a sintered product of the above glass ceramics, therefore, it is allowed to obtain a ceramic wiring board having a high coefficient of thermal expansion and a small difference in the thermal expansion from the external circuit board such as printed board, effectively avoiding inconvenience caused by the thermal stress that stems from the operation of the semiconductor devices. Further, the sintered product of glass ceramics has a high dielectric constant which makes it possible to obtain a ceramic wiring board of tho type of incorporating a capacitor by using the sintered product of the glass ceramics.

With the sintered product of the glass ceramics, therefore, the sintering is greatly impaired depending upon the filler component such as $BaTiO_3$ or $CaTiO_3$, making it difficult to obtain a densely sintered product at low temperatures and hindering the effort for realizing the practical use.

SUMMARY OF THE INVENTION

It is therefore an object of the present invention to provide a ceramic wiring board provided with an insulating layer of a high dielectric constant formed of a sintered product of glass ceramics having a high coefficient of thermal expansion and a high dielectric constant, the ceramic wiring board suited for being reliably mounted an a printed board of an insulating material of an organic resin.

Another object of the present invention is to provide a ceramic wiring board incorporating a capacitor.

According to the present invention, there is provided a ceramic wiring board provided with an insulating layer of a high dielectric constant (high dielectric layer) formed of a ceramic sintered product having a high dielectric constant, wherein said ceramic sintered product contains a crystal phase of lanthanum titanate and a glass phase present on the grain boundaries of said crystal phase, and the ceramic sintered product has a coefficient of thermal expansion at 40 to 400° C. of not greater than $8 \times 10^{-6}/°$ C., a specific inductive capacity at 1 MHz of not smaller than 10, and a porosity of not more than 0.5%.

That is, the high dielectric layer possessed by the ceramic wiring board of the present invention is formed of the ceramic sintered product obtained by firing a filler component containing at least lanthanum titanate together with a glass component of a high thermal expansion. Since the lanthanum titanate is being used, the ceramic sintered product is excellently sintered, is dense, and contains a crystal phase of lanthanum titanate. Besides, a glass phase exists on the grain boundaries of the crystal phase and, hence, the ceramic sintered product exhibits a coefficient of thermal expansion at 40 to 400° C. of not smaller than $8 \times 10^{-6}/°$ C. and a specific inductive capacity at 1 MHz of not smaller than 10. Therefore, even when the ceramic wiring board of the present invention is put to the heat cycle in a state where it is mounted on an external circuit board made of an insulating substrate of an organic resin such as a printed board, generation of a thermal stress due to the difference in the thermal expansion is suppressed and a stably mounted state is maintained for extended period of time.

Further the ceramic sintered product forming the high dielectric layer can be co-fired with the conventional glass ceramic sintered product of a high thermal expansion, and can be easily laminated on the insulating layer of the glass ceramic sintered product of a high thermal expansion. Accordingly, the ceramic wiring board of the invention can assume various laminated layer structures. For instance, the high dielectric layer is laminated on a glass ceramic insulating layer of a low dielectric constant and of a high thermal expansion so as to be incorporated in the insulating substrate, in order to further decrease the difference in the coefficient of thermal expansion from the external circuit board. Besides, the ceramic wiring board having such a laminated layer structure is of a structure that contains the capacitor. By arranging the high dielectric layer between a pair of electrode layers, therefore, an electrostatic capacity as a capacitor can be drawn out, eliminating the need of mounting such parts to capacitor devices and offering a great advantage from the standpoint of realizing the electronic device as a whole inclusive of the wiring board in a small size.

In the present invention, it is desired that the lanthanum titanate is expressed by the following formula,

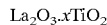

wherein x is a mol fraction satisfying $2 \leq x \leq 5$.

Upon selecting the value x within the above range, it is allowed to adjust the dielectric constant and the coefficient of thermal expansion of the obtained ceramic sintered product.

Figure 1:
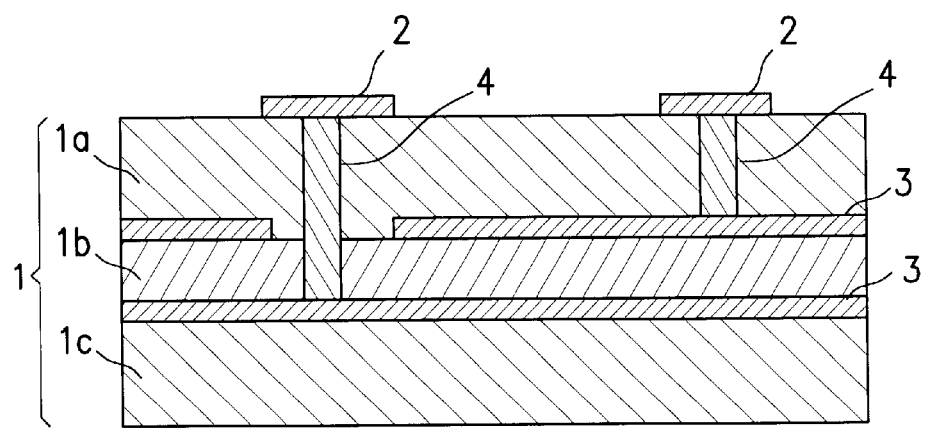
FIG. 1 is a side sectional view schematically illustrating a layer structure of a ceramic wiring board according to the present invention.

DETAILED DESCRIPTION OF THE INVENTION (Glass Component)

In a ceramic wiring board of the present invention, a glass component used for producing a ceramic sintered product for forming an insulating layer of a high dielectric constant, is a known glass of a high thermal expansion that has heretofore been used for forming an insulating substrate of the wiring board of this type, such as a glass having a coefficient of thermal expansion at 40 to 400° C. of from 6 to 18 $\times 10^{-6}/°$ C. and, particularly, a glass having resistance against chemicals in a step of plating. Preferred examples include a lithium silicate glass, a PbO glass, a BaO glass and a ZnO glass. In the case of a crystallized glass, the coefficient of thermal expansion of the glass component stands for a coefficient of thermal expansion after the heat treatment at a firing temperature, which is a coefficient of linear expansion.

The lithium silicate glass contains $Li_2O$ in an amount of from 5 to 30% by weight and, particularly, from 5 to 20% by weight. Preferably used is the one that precipitates lithium silicate having a large coefficient of thermal expansion after firing. The lithium silicate glass further contains $SiO_2$ in addition to $Li_2O$. Here, it is desired that $SiO_2$ exists at a ratio of 60 to 85% by weight in the whole glass, and the total amount of $SiO_2$ and $Li_2O$ is from 65 to 95% by weight in the whole glass from the standpoint of precipitating the lithium silicated crystals. In addition to these components, there may be further contained $Al_2O_3$, MgO, $TiO_2$, $B_2O_3$, $Na_2O$, $K_2O$, $P_2O_5$, ZnO and F. It is desired that the content of $B_2O_3$ in the lithium silicate glass is not larger than 1% by weight from the standpoint of resistance against chemicals and resistance against water.

The PbO glass comprises PbO as a chief component and further contains at least one of $B_2O_3$ or $SiO_2$, and there is preferably used the one that precipitates a crystal phase of a high thermal expansion such as $PbSiO_3$ or $PbZnSiO_4$ after firing. In particular, there is desirably used a crystalline glass comprising PbO (65 to 85% by weight)—$B_2O_3$ (5 to 15% by weight)—ZnO (6 to 20% by weight)—$SiO_2$ (0.5 to 5% by weight)—BaO (0 to 5% by weight) or a crystalline glass comprising PbO (50 to 60% by weight)—$SiO_2$ (35 to 50% by weight)—$Al_2O_3$ (1 to 9% by weight).

The ZnO glass contains not less than 10% by weight of ZnO and is preferably the one that precipitates a crystal phase of a high thermal expansion after firing, such as $ZnO.Al_2O_3$ or $ZnO.nB_2O_3$. In addition to ZnO, there may be contained $SiO_2$ (not lager than 60% weight), $Al_2O_3$ (not lager than 60% by weight), $D_2O_3$ (not larger than 30% by weight), $P_2O_5$ (not larger than 50% by weight), alkaline earth oxides (not larger than 20% by weight), and $Bi_2O_3$ (not larger than 30% by weight). In particular, it is desired to use a crystalline glass comprising ZnO (10 to 50% by weight)—$Al_2O_3$ (10 to 30% by weight)—$SiO_2$ (30 to 60% by weight) or a crystalline glass comprising ZnO (10 to 50% by weight)—$SiO_2$ (5 to 40% by weight)—$Al_2O_3$ (0 to 15% by weight)—BaO (0 to 60% by weight)—MgO (0 to 35% by weight.

The BaO glass contains not less than 5% by weight of BaO and can be used as a non-crystalline glass or a crystalline glass that precipitates a crystal phase after firing, such as $BaO.2SiO_2$, $BaAl_2Si_2O_8$, or $BaB_2Si_2O_8$. In addition to BaO, there may be contained $SiO_2$, $Al_2O_3$, $B_2O_3$, $P_2O_5$, alkaline earth metal oxides, alkaline metal oxide and $ZrO_2$.

Among the above-mentioned various glasses in the present invention, it is particularly desired to use the one that contains an alkaline earth metal oxide such as BaO in an amount of 15 to 45% by weight, $SiO_2$ in an amount of 30 to 60% by weight and $ZrO_2$ in an amount of 1 to 20% by weight. That is, when the content of the alkaline earth metal oxide is smaller than the above range or when the content of $SiO_2$ is larger than the above range, it becomes difficult to obtain a ceramic sintered product having a high thermal expansion and a high dielectric constant. When the content of $SiO_2$ is smaller than the above range, the obtained ceramic sintered product tends to exhibit an increased dielectric loss. When the content of $ZrO_2$ is larger than the above range, further, it becomes difficult to obtain a ceramic sintered product of high thermal expansion. Further, when the content of $ZrO_2$ is smaller than the above range, the alkaline earth metal component and Si component in the glass component tend to precipitate easily in the crystal phase, whereby the amount of $SiO_2$ in the glass phase decreases and the obtained ceramic sintered product tends to exhibit an increased dielectric loss.

It is further desired that the glass has a yield point of from 400 to 800° C. and, particularly, from 400 to 700° C. this is because, in molding a mixture of a glass and a filler, a molding binder such as an organic resin is added. Prior to the firing, however, it is desired to efficiently remove the binder, bring the firing conditions for metallization into match with the conditions for firing the molded article (ceramic green sheet for forming the insulating layer), and to co-fire the metallize with the ceramic green sheet. When the yield point of the glass is lower than 400° C., for example, the glass starts to be sintered at a low temperature, which makes it difficult to effect the co-firing with the metallize such as Ag or Cu (having a sintering temperature of from 600 to 800° C.). Besides, the molded article tends to become dense at a low temperature and, hence, the binder is not effectively decomposed or volatilized; i.e., the binder component remains to affect the properties of the obtained ceramic wiring board. When the yield point is higher than 800° C., on the other hand, the sintering is not accomplished unless the amount of glass is increased. Namely, the expensive glass must be used in increased amounts making it difficult to reduce the cost.

(Filler Components)

It is desired that the filler component used together with the above glass component is favorably sintered together with the glass component, has a coefficient of thermal expansion at 40 to 400° C. of not smaller than $9\times10^{-6}/°$ C., and a specific inductive capacity at 1 MHz of not smaller than 13 and, preferably, not smaller than 20. When the filler has a coefficient of thermal expansion of not larger than $9\times10^{-6}/°$ C., it becomes difficult to control the coefficient of thermal expansion of the sintered product to be not smaller than $8\times10^{-6}/°$ C. and, particularly, not smaller than $9\times10^{-6}/°$ C. Further, when the filler component has a small coefficient of thermal expansion, the coefficient of thermal expansion of the glass component must be increased. It is therefore desired that the filler component has a coefficient of thermal expansion of not smaller than $12\times10^{-6}/°$ C.

[Filler Component (a)]

According to the present invention, it is important to use at least the lanthanum titanate as a filer component. Use of the lanthanum titanate makes it possible to obtain a dense glass ceramic sintered product without impairing the sintering property.

The lanthanum titanate is expressed by the following general formula,

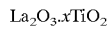

$La_2O_3.xTiO_2$ wherein x is a mol fraction satisfying $2\leq x\leq 5$.

The following properties are exhibited depending upon the value x.

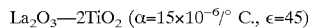

$La_2O_3$—$2TiO_2$ ($\alpha=15\times10^{-6}/°$ C., $\epsilon=45$)

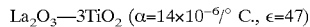

$La_2O_3$—$3TiO_2$ ($\alpha=14\times10^{-6}/°$ C., $\epsilon=47$)

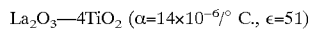

$La_2O_3$—$4TiO_2$ ($\alpha=14\times10^{-6}/°$ C., $\epsilon=51$)

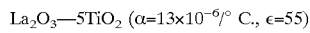

$La_2O_3$—$5TiO_2$ ($\alpha=13\times10^{-6}/°$ C., $\epsilon=55$)

wherein $\alpha$ is a coefficient of thermal expansion at 40 to 400° C. and $\epsilon$ is a specific inductive capacity at 1 MHz. Hereinafter, the coefficient $\alpha$ of thermal expansion is that of at 40 to 400° C. and the specific inductive capacity $\epsilon$ is that of at 1 MHz unless stated otherwise.

By using the lanthanum titanate in combination with the above-mentioned glass component, it is allowed to obtain a densely sintered product. By controlling the blending ratio of the lanthanum titanate, further, it is allowed to easily control the coefficient $\alpha$ of thermal expansion and the specific inductive capacity $\epsilon$. When the glass component having a thermal expansion coefficient $\alpha$ of, for example, $6.5\times10^{-6}/°$ C. is used, it becomes possible to control the thermal expansion coefficient $\alpha$ and the specific inductive capacity $\epsilon$ of the sintered product over the ranges of $10\leq\alpha\leq12$ and $14\leq\epsilon\leq25$. It will be further understood that a sintered product having a thermal expansion coefficient $\alpha$ of not smaller than 12 can be obtained by using a glass component of a high thermal expansion having a coefficient $\alpha$ of thermal expansion of higher than $6.5\times10^{-6}/°$ C. According to the present invention as described above, the glass component and the lanthanum titanate are suitable combined together to obtain a sintered product having a large thermal expansion coefficient $\alpha$. the insulating layer having a high dielectric constant (high dielectric layer) of the wiring board formed of the above sintered product exhibits a thermal expansion coefficient close to the thermal expansion coefficient of the external circuit board.

In the present invention, it is also allowable to add an $La_2O_3$ powder and a $TiO_2$ powder to the glass component followed by firing to form the lanthanum titanate in the sintered product. From the standpoint of improving the sintering property at low temperatures, however, it is desired to calcine a mixture powder of $La_2O_3$ powder and $TiO_2$ powder at 1200 to 1500° C. to prepare an $La_2O_3.nTiO_2$ powder which is then pulverized into an average particle diameter of 1 to 50 μm. This powder is then mixed to the glass component and is fired. When x>2, this composite oxide may often be $La_2O_3.2TiO_2+TiO_2$.

In order to achieve a desired coefficient of thermal expansion and a desired specific inductive capacity relying upon the value x of the lanthanum titanate $La_2O_3.xTiO_2$ (x is a mol fraction, $2\leq x\leq 5$), it is also necessary to suitably adjust the blending amount of the filler. Concretely speaking, as will become obvious from Examples appearing later, the range for accomplishing high thermal expansion gradually decreases with an increase in the x-value and when x>5, it becomes difficult to accomplish a high thermal expansion unless a glass of a large thermal expansion is used.

In a range where the sintering property is not impaired, further, it is allowed to use other high thermal expansion fillers (for example, at least one kind selected from the group consisting of the following filler components (b), (c) and (d)) in combination with the above-mentioned lanthanum titanate (filler component (a)) and to use other known fillers in combination.

[Filler component (b)]

In the present invention, it is allowable to use at least one titanium compound selected from the group consisting of calcium titanate, strontium titanate, barium titanate and titania together with the lanthanum titanate. These titanium compounds have the following properties:

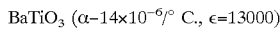

$BaTiO_3$ ($\alpha$-$14\times10^{-6}/°$ C., $\epsilon=13000$)

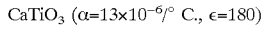

$CaTiO_3$ ($\alpha=13\times10^{-6}/°$ C., $\epsilon=180$)

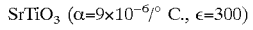

$SrTiO_3$ ($\alpha=9\times10^{-6}/°$ C., $\epsilon=300$)

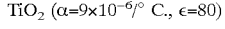

$TiO_2$ ($\alpha=9\times10^{-6}/°$ C., $\epsilon=80$)

That is, the above-mentioned lanthanum titanate (filler component (a)) only is not enough for overcoming the limitation on the dielectric constant. By using the above-mentioned titanium compounds in combination, however, it is allowed to further increase the specific inductive capacity $\epsilon$ of the sintered product, e.g., to increase the specific inductive capacity of the sintered product to be not smaller than 14 and, particularly, not smaller than 25.

Among these titanium compounds, the $TiO_2$ (rutile) has a small specific inductive capacity compared to other fillers having large dielectric constants but is effective in enhancing the sintering property by being formed as a composite product with the lanthanum titanate. By using, for example, $La_2O_3.2TiO_2$ and $TiO_2$ in combination, further, the $TiO_2$ works to control the value x of $La_2O_3.xTiO_2$ making it possible to control the sintering property, specific inductive capacity and thermal expansion property.

In the present invention, it is desired to use the above titanium compound (filler component (b)) in an amount of from 20 to 80% by weight per the sum of the above filler component (a)(lanthanum titanate) and the filler component (b). When the amount exceeds 80% by weight, it becomes difficult to obtain a densely sintered product and the coefficient of thermal expansion of the sintered product may decrease. When its amount is smaller than 20% by weight, on the other hand, the sintering property can be advantageously improved but the action for improving the specific inductive capacity by the use of the titanium compound is not exhibited to a sufficient degree.

[Filler component (c)]

In the present invention, it is desired to use at least one kind of a zirconium-containing oxide such as the one selected from the group consisting of $ZrO_2$, $MgZrO_3$, $CaZrO_3$, $SrZrO_3$ and $BaZrO_3$ in addition to the above-mentioned filler component (a) or the filler components (a) and (b).

That is, these zirconium-containing oxides exhibit not only excellent sintering properties but also relatively high specific inductive capacities $\epsilon$ as shown below:

$ZrO_2$ ($\alpha=10\times10^{-6}/°$ C., $\epsilon=30$)

$MgZrO_3$ ($\alpha=9.2\times10^{-6}/°$ C., $\epsilon=32$)

$CaZrO_3$ ($\alpha=9.2\times10^{-6}/°$ C., $\epsilon=32$)

$SrZrO_3$ ($\alpha=9.5\times10^{-6}/°$ C., $\epsilon=30$)

$BaZrO_3$ ($\alpha=9.3\times10^{-6}/°$ C., $\epsilon=40$)

By using the zirconium-containing oxide in combination with the filler component (a) or the filler components (a) and (b), it is allowed to improve the sintering property and to obtain a ceramic sintered product having a large specific inductive capacity. Besides, the zirconium-containing oxide suppresses a reduction in the amount of $SiO_2$ in the glass component in the firing step and further suppresses the glass component from gaining a high an $\delta$.

In the present invention, it is desired that the above zirconium-containing oxide is used in an amount of from 5 to 30% by weight per the sum of the filler components (a) to (c). When its amount of use is smaller than 5% by weight, the densely sintered product tends to exhibit a small specific inductive capacity $\epsilon$ and when its amount of use exceeds 30% by weight, on the other hand, the thermal expansion coefficient $\alpha$ of the sintered product may decrease. In the present invention, $ZrO_2$ is particularly preferably used among the above zirconium-containing oxides. Particularly, by using the filler components (a), (b) and (c) in combination, it is possible to obtain a ceramic sintered product which has a thermal expansion coefficient at 40 to 400° C. of not smaller than $8\times10^{-6}/°$ C. and a specific inductive capacity at 1 MHz of not smaller than 14.

[Filler component (d)]

In the present invention, a magnesium titanate is used in addition to the above-mentioned filler components (a) to (c) to lower the dielectric loss tangent (tan $\delta$) of the obtained ceramic sintered product. The ceramic sintered product obtained by using the magnesium titanate in combination exhibits the tan $\delta$ at 1 MHz to 3 GHz of not larger than $25\times10^{-4}$ making it possible to decrease the transmission loss for high-frequency signals of the ceramic wiring board.

Further, the magnesium titanate exhibits the following property, $MgTiO_3$ ($\alpha=9\times10^{-6}/°$ C., $\epsilon=45$)

Owing to the use of the magnesium titanate, a high dielectric constant and a large thermal expansion are not impaired by the filler components. The ceramic sintered product obtained by using the magnesium titanate in combination exhibits a specific inductive capacity of, for example, not smaller than 14 at 1 MHz to 3 GHz.

In the present invention, it is desired that the magnesium titanate (filler component (d)) is used in an amount of 20 to 80% by weight per the sum of the filler components (a) (lanthanum titanate) and (d) from the standpoint of lowering the tan $\delta$ without impairing the sintering property, high dielectric constant and high thermal expansion accomplished by the use of the lanthanum titanate. When the magnesium titanate is used, further, it is desired that the filler component (b) is used in an amount of 20 to 80% by weight per the sum of the filler components (a), (b) and (d), and that the filler component (c) is used in an amount of 5 to 30% by weight per the sum of the filler components (a) to (d).

[Other filler components]

In the present invention as described earlier, the known fillers can be used in combination in a range in which they do not impair the sintering property or the like property and, thus, the specific inductive capacity and the thermal expansion coefficient of the ceramic sintered product can be finely adjusted. Described below are examples of the known fillers i.e., quartz, cristobalite, tridymite, $ZrO_2$, MgO, petalite, forsterite ($2MgO.SiO_2$), spinel ($MgO.Al_2O_3$), wollastonite ($CaO.SiO_2$), monticellite ($CaO.MgO.SiO_2$), napheline ($Na_2O.Al_3O_3.SiO_2$), lithium silicate ($Li_2O.SiO_2$), diopside ($CaO.MgO.2SiO_2$), merbinite ($2CaO.MgO.2SiO_2$), alermanite ($2CaO.MgO.2SiO_2$), carnegieite ($Na_2O.Al_2O_3.2SiO_2$), enstatite ($MgO.SiO_2$), magnesium borate ($2MgO.B_2O_3$), celsian ($BaO.Al_2O_3.2SiO_2$), $D_2O_3.2MgO.2SiO_2$, garneirite ($ZnO.Al_2O_3$), $CaTiO_3$, $BaTiO_3$, $SrTiO_3$, $TiO_2$, etc.

(Preparation of Ceramic Sintered Product)

In the present invention, the ceramic sintered product for forming an insulating layer of a high dielectric constant high dielectric layer in the ceramic wiring substrate is obtained by preparing a slurry by adding a suitable organic resin binder and, as required, a solvent and a plasticizer to a starting mixture powder of the glass component and the filler component, and forming a ceramic green sheet by a suitable molding means, followed by firing.

It is desired that the starting mixture powder usually comprises 35 to 70% by volume of a glass component and 30 to 65% by volume of a filler component. That is, when the amount of the glass component is small (when the amount of the filler component is large) in the starting mixture powder, it may be difficult to obtain a densely sintered product by co-firing with the metallize (comprising a low-resistance metal such as copper or Ag) that forms wiring conductor. When the amount of the glass component is large (when the amount of the filler component is small), on the other hand, it becomes difficult to increase the specific inductive capacity of the sintered product. In order that the above-mentioned lanthanum titanate exhibits its effect to a sufficient degree, further, it is desired to so select the amount of the lanthanum titanate in the filler component depending upon the kind of the filler component used in combination that the amount of crystal phase of the lanthanum titanate precipitates in an amount of not smaller than 10% by weight in the obtained sintered product.

The slurry prepared by adding tho organic resin binder to the above-mentioned starting mixture powder is molded by a known means such as a metal mold press, a cold hydrostatic press, an injection molding, an extrusion molding, a doctor blade method, a calendar roll method or a rolling method.

The above organic resin binder is removed prior to firing the molded article (ceramic green sheet) obtained by the above molding method. The binder is removed in an open atmosphere at about 700° C. To obtain a wiring board of which the wiring conductor is copper, the binder is removed at 100 to 700° C. in a nitrogen atmosphere containing the water vapor. To effectively remove the binder in this case, it is desired that the shrinking starting temperature of the molded article is about 700 to about 850° C. To select the shrinking start temperature to lie within the above-mentioned range, there may be used a glass of which the yield point lies within the above-mentioned range as described already.

The firing may be conducted in an oxidizing atmosphere or in a nonoxidizing atmosphere at 850 to 1050° C. to obtain a ceramic sintered product which is so dense as to exhibit a relative density of not lower than 90%. When the firing temperature is lower than 850° C. it becomes difficult to increase the density. When the firing is conducted at a temperature higher than 1050° C., on the other hand, the metallized wiring layer (wiring conductor) provided in the ceramic wiring board melts, and the metallized wiring layer can no longer be formed by co-firing. When copper is used for forming the metallized wiring layer, the firing (co-firing) is conducted in a nonoxidizing atmosphere.

Since the thus prepared ceramic sintered product uses the lanthanum titanate as a filler component, the crystal phase of lanthanum titanate has been precipitated in an amount of, for example, not smaller than 10% by weight. Besides, the glass phase exists on the grain boundaries of the crystal phase. Depending upon the kind of the filler component used in combination with the glass component and the lanthanum titanate, there may exist a crystal phase formed by the reaction with the glass component and the filler component, a crystal phase due to the filler component or a crystal phase formed by the decomposition of the filler component. When, for example, the above-mentioned filler components (b) and (d) are used in combination, there is precipitated a crystal phase of a composite oxide containing Ti and an alkaline earth metal (Ca, Sr, Ba, Mg). When the filler component (c) is used in combination, further, zirconium exists as a solid solution in the glass phase and/or in the crystal phase of the above composite oxide. Due to $SiO_2$ in the glass component, further, there often precipitates a crystal phase of a composite oxide containing Si and an alkaline earth metal.

In the present invention, it is desired to suppress the composite oxide containing the alkaline earth metal and Si from being precipitated in the crystal phase from the viewpoint of decreasing the tan δ. Concretely speaking, it is desired that a peak intensity ratio ($I/I_0$), as measured by an X-ray diffraction method, is smaller than 1, wherein "I", means a maximum peak intensity of detected composite oxides containing alkaline earth metal and Si, and "$I_0$" means a maximum peak intensity of detected oxides containing Ti. This is because when the composite oxide precipitates much, the amount of $SiO_2$ decreases in the glass phase and the tan δ of the sintered product may increase. Described below are examples of the composite oxide suppressing the precipitation:

celsian ($BaO.Al_2O_3.2SiO_2$),
forsterite ($2MgO.SiO_2$),
enstatite ($MgO.SiO_2$),
diopside ($CaO.MgO.2SiO_2$),
merbinite ($2CaOMgO.2SiO_2$),
akermanite ($2CaO.MgO.2SiO_2$),
$CaTiSiO_5$,
$Ba_2TiSi_2O_8$.

In the present invention, further, the above-mentioned ceramic sintered product is highly dense since the lanthanum titanate has been used as the filler component, and has a porosity of, for example, as small as 0.5% or less. That is, the porosity of the sintered product is a very small.

Further, the ceramic sintered product has a thermal expansion coefficient α at 40 to 400° C. of not smaller than $8\times10^{-6}/°$ C. and, particularly, not smaller than $9\times10^{-6}/°$ C. and, most preferably, not smaller than $10\times10^{-6}/°$ C. as well as a specific inductive capacity at 1 MHz of not smaller than 10, particularly, not smaller than 14 and, more particularly, not smaller than 17. Besides, the ceramic sintered product is obtained by firing at 850 to 1050° C., it is capable of co-firing with the firing of a low-resistance metal such as copper. Accordingly, the ceramic sintered product can be used as an insulating layer of a high dielectric constant and a high thermal expansion in the wiring board.

(Ceramic Wiring Board)

In the ceramic wiring board of the present invention, the above-mentioned ceramic sintered product of a high dielectric constant and a high thermal expansion is used as an insulating substrate material for the wiring board. The ceramic sintered product by itself may constitute an insulating substrate. Usually, however, the ceramic sintered product is laminated on a glass ceramic sintered product of a low dielectric constant to obtain the wiring board in a small size.

FIG. 1 shows a representative structure of the ceramic wiring board of the present invention.

The wiring board has an insulating substrate 1 of a multi-layer structure formed by laminating ceramic insulating layers 1a, 1b and 1c. Metallized wiring layers 2 of a low-resistance conductor such as copper or Ag are arranged on the surface of the insulating substrate 1. Though not diagramed, the metallized wiring layer 2 can also be formed even inside the insulating substrate 1.

In the present invention, at least a layer 1b (hereinafter called a high dielectric layer) among the ceramic insulating layers 1a, 1b and 1c is formed of the above-mentioned ceramic sintered product having a high thermal expansion and a high dielectric constant, and electrode layers 3, 3 of a conductor such as copper are formed over and under thereof, the electrode layers 3, 3 being connected to the metallized wiring layers 2, 2 on the surface of the insulating substrate 1 via through-hole conductors 4, 4. In the wiring board of the present invention in which the high dielectric layer 1b is arranged between the electrode layers 3 and 3, a capacitor is formed by the high dielectric layer 1b, and a predetermined electrostatic capacity between the wiring layers 2 and 2 is taken out by the through-hole conductors 4, 4.

It is desired that the ceramic insulating layers 1a and 1c (hereinafter referred to as low dielectric layers) holding the above high dielectric layer 1b therebetween, are formed of a glass ceramic sintered product of a low specific inductive capacity which is smaller than 10. By forming the low dielectric layers 1a and 1c as described above, there is obtained a ceramic wiring board of the type of incorporating the capacitor.

In the present invention, it is desired that the glass ceramic sintered product having a low dielectric constant is obtained by being co-fired with the ceramic sintered product having a high dielectric constant, as a matter of course. In order to increase the thermal stability of the wiring board and to avoid the peeling of the insulating layer caused by the thermal stress and the development of cracks, further, it is desired that the glass ceramic sintered product of a low dielectric constant has a thermal expansion at 40 to 400° C. which is different by not more than 0.5 ppm/° C. from that of the ceramic sintered product of a high dielectric constant and, particularly, has a coefficient of thermal expansion at 40 to 400° C. larger than that of the ceramic sintered product of a high dielectric constant.

It as therefore desired that the glass ceramic sintered product of a low dielectric constant contains a glass component which is substantially the same as the glass component used for the production of the ceramic sintered product of a high dielectric constant, e.g., contains a glass component that exhibits a coefficient of thermal expansion at 40 to 400° C. of 6 to $18 \times 10^{-6}$/° C., and is obtained by firing a mixture of the above glass component and a filler component of a low dielectric constant. As the filler component of a low dielectric constant, there can be used quartz and the one capable of precipitating a composite oxide crystal ($MgSiO_3$, $Mg_2SiO_5$, etc.) containing Si and Mg upon the firing, such as forsterite, enstatite or diopside. In the present invention, however, it is most desired to use the forsterite that is capable of being transformed into enstatite or diopside upon the firing. Upon adjusting the amount of the filler component, it is allowed to adjust the coefficient of thermal expansion of the glass ceramic sintered product of a low dielectric constant. Upon firing a mixture of, for example, 35 to 60% by volume of the glass component and 40 to 65% by volume of the filler component, there is obtained a glass ceramic sintered product of a low dielectric constant having a specific inductive capacity $\epsilon$ of smaller than 10 and a coefficient $\alpha$ of thermal expansion that is adjusted to lie in a range of from 8 to 12 ppm/° C.

Described below is how to prepare the ceramic wiring board of the structure shown in FIG. 1 equipped with the high dielectric layer 1b composed of the ceramic sintered product of a high dielectric constant and with the low dielectric layers 1a, 1c composed of the glass ceramic sintered product of a low dielectric constant.

That is, by using the glass components and filler components selected depending upon the kinds of the insulating layers that are to be formed, there are formed a ceramic green sheet for forming the low dielectric layers 1a, 1e and a ceramic green sheet for forming the high dielectric layer 1b according to the method described concerning the preparation of the ceramic wintered product of a high dielectric constant.

An organic binder, a solvent and a plasticizer are added and mixed into a powder of a low-resistance metal such as copper or Ag to prepare a metal paste which is then printed onto the above-mentioned green sheets by a known application means such as screen-printing method or the like method to thereby form patterns corresponding to the metallized wiring layers 2 and electrically conducting layers corresponding to the electrode layers 3. Through-holes are formed by blanking or the like method in the green sheets of the insulating layers in which the through-hole conductors 4 are to be formed, and the holes are filled with a metal paste.

The thus formed green sheets are laminated one upon the other while matching their positions, followed by the removal of the organic resin binder and the co-firing, thereby to obtain the ceramic wiring board having the structure shown in FIG. 1.

The thus obtained ceramic wiring board of the present invention contains a capacitor formed by the dielectric layer 1b. Therefore, electric circuit devices obtained by mounting the above wiring board on the external circuit boards require no capacitor and, hence, the devices can be realized in small sizes. Further, the wiring board has a coefficient of thermal expansion which is little different from that of the organic resin used for the formation of an external circuit board such as printed board. When mounted on the external circuit board by utilizing a ball grid array (BGA), therefore, ball-like solder terminals are effectively avoided from being broken down by the thermal stress, and stable and reliable connection is maintained for extended periods of time.

In the embodiment of FIG. 1, the insulating board 1 is formed by three insulating layers. So far as the insulating layer of the ceramic sintered product having a high dielectric constant and a high thermal expansion is provided, however, the number of the insulating layers may be four or more layers, or may be two layers. Besides, the number of the insulating layer having a high dielectric constant is not limited to one layer only, either.

EXPERIMENT (Experiment 1—1)

A glass powder (yield point of 700° C., coefficient of thermal expansion of $6.5 \times 10^{-6}$/° C., Pb amount of not larger than 50 ppm) comprising 41% by weight of $SiO_2$—37% by weight of BaO—10% by weight of $B_2O_3$—7% by weight of $Al_2O_3$—5% by weight of CaO was prepared, and filer powders shown in Table 1 were prepared. In Table 1, the coefficients of thermal expansion are those at 40 to 400° C.

The fillers of Table 1 were each weighed by 50% by volume and were added to 50% by volume of the glass powder, followed by the addition of a solvent, and were then pulverized and mixed by using a ball mill. Thereafter, an organic binder and a plasticizer were added and mixed to a sufficient degree to prepare slurries from which green sheets having a thickness of 500 μm were prepared by the doctor blade method.

Samples measuring 50 mm×50 mm were cut out from the thus obtained green sheets, were pressed, and from which the binder was removed at 700° C. in a nitrogen atmosphere containing water vapor. The samples ware then fired at 910° C. in a nitrogen atmosphere to obtain sintered products (Samples Nos. 1 to 9).

In the fillers of Table 1, the lanthanum titanate was obtained by mixing a $TiO_2$ powder and an $La_2O_3$ powder at a composition ratio of $La_2O_3.xTiO_2$ (x=2, 3, 4, 5), calcining the mixture at 1400° C. and pulverizing the calcined product into an average particle diameter of 2 μm.

The obtained sintered products were measured for their porosities by the Archimedes' method and were measured for their coefficients of thermal expansion at 40 to 400° C. and for their dielectric constants. The results were as shown in Table 1.

TABLE 1

| No. | Filler material | Coefficient of thermal expansion of filler ($\times 10^{-5}/°$ C.) | Dielectric constant of filler | Coefficient of thermal expansion of sintered product ($\times 10^{-6}/°$ C.) | Porosity (%) | Dielectric constant of sintered product |
|---|---|---|---|---|---|---|
| 1 | $La_2O_3$—$2TiO_2$ | 15 | 45 | 10.8 | 0.22 | 17.4 |
| 2 | $La_2O_3$—$3TiO_2$ | 14 | 47 | 10.7 | 0.25 | 18.3 |
| 3 | $La_2O_3$—$4TiO_2$ | 13 | 51 | 10.4 | 0.12 | 19.0 |
| 4 | $La_2O_3$—$5TiO_2$ | 13 | 55 | 9.7 | 0.08 | 19.2 |
| 5 | $BaTiO_3$ | 14 | 13000 | not measurable | >10 | not measurable |
| 6 | $CaTiO_3$ | 13 | 180 | not measurable | >10 | not measurable |
| 7 | $SrTiO_3$ | 9 | 300 | not measurable | >10 | not measurable |
| 8 | $TiO_2$ | 9 | 80 | not measurable | >10 | not measurable |
| 9 | $ZrO_3$ | 10 | 30 | not measurable | >10 | not measurable |

As will be obvious from the results of Table 1, when the lanthanum titanate is used, there are obtained more densely sintered products than when other fillers are used, and the thermal expansion and the dielectric constant are enhanced, too.

(Experiment 1–2)

Sintered products (samples Nos. 10 to 37) were prepared in the same manner as in Experiment 1—1 but changing the composition ratio of lanthanum titanate and glass as shown in Tables 2 to 5, and their properties were evaluated. The results were as shown in Tables 2 to 5.

TABLE 2

| No. | 10 | 11 | 12 | 13 | 14 | 15 | 16 |
|---|---|---|---|---|---|---|---|
| Glass (vol. %) | 30 | 35 | 40 | 45 | 55 | 60 | 70 |
| $La_2O_3$—$2TiO_2$ (vol. %) | 70 | 65 | 60 | 55 | 45 | 40 | 30 |
| Porosity (%) | 12.4 | 0.5 | 0.42 | 0.43 | 0.15 | 0.05 | 0.03 |
| Coefficient of thermal expansion (x$10^{-6}/°$ C.) | — | 12.0 | 11.6 | 11.2 | 10.3 | 10.0 | 9.5 |
| Dielectric constant | — | 22.9 | 21.3 | 18.9 | 15.5 | 14.1 | 9.5 |

TABLE 3

| No. | 17 | 18 | 19 | 20 | 21 | 22 | 23 |
|---|---|---|---|---|---|---|---|
| Glass (vol. %) | 30 | 35 | 40 | 45 | 55 | 60 | 70 |
| $La_2O_3$—$2TiO_2$ (vol. %) | 70 | 65 | 60 | 55 | 45 | 40 | 30 |
| Porosity (%) | 23.5 | 2.6 | 0.4 | 0.4 | 0.1 | 0.05 | 0.03 |
| Coefficient of thermal expansion (x$10^{-6}/°$ C.) | — | — | 11.1 | 10.7 | 10.0 | 9.6 | 9.0 |
| Dielectric constant | — | — | 23.2 | 20.2 | 16.6 | 14.8 | 9.8 |

TABLE 4

| No. | 24 | 25 | 26 | 27 | 28 | 29 | 30 |
|---|---|---|---|---|---|---|---|
| Glass (vol. %) | 30 | 35 | 40 | 45 | 55 | 60 | 70 |
| $La_2O_3$—$2TiO_2$ (vol. %) | 70 | 65 | 60 | 55 | 45 | 40 | 30 |
| Porosity (%) | 24.3 | 3.2 | 0.3 | 0.3 | 0.05 | 0.05 | 0.03 |
| Coefficient of thermal expansion (x$10^{-6}/°$ C.) | — | — | 10.7 | 10.4 | 9.7 | 9.3 | 8.0 |
| Dielectric constant | — | — | 24.1 | 21.6 | 16.9 | 15.1 | 11.0 |

TABLE 5

| No. | 31 | 32 | 33 | 34 | 35 | 36 | 37 |
|---|---|---|---|---|---|---|---|
| Glass (vol. %) | 30 | 35 | 40 | 45 | 55 | 60 | 70 |
| $La_2O_3$—$2TiO_2$ (vol. %) | 70 | 65 | 60 | 55 | 45 | 40 | 30 |
| Porosity (%) | 18.6 | 0.8 | 0.4 | 0.2 | 0.05 | 0.03 | 0.03 |
| Coefficient of thermal expansion (x$10^{-6}/°$ C.) | — | — | 10.3 | 10.0 | 9.3 | 9.0 | 8.4 |
| Dielectric constant | — | — | 25.0 | 22.1 | 17.2 | 15.2 | 12.5 |

As will be obvious from the results of Tables 2 to 5, good and dense products are not obtained when the amount of the glass component is small (e.g., smaller than 35% by volume). When the amount of the glass component becomes too large (e.g., larger than 60% by volume), it becomes difficult to obtain a sintered product having a high dielectric constant or a high coefficient of thermal expansion.

In the case of the glass used in this experiment, the sintering property becomes poor and the coefficient of thermal expansion decreases as x of $La_2O_3 \cdot xTiO_2$ (x=2, 3, 4, 5) increases.

When it is desired to increase the thermal expansion by increasing the amount of the glass, it is recommended to use a glass having a higher thermal expansion.

(Experiment 2-1)

$La_2O_3 \cdot 2TiO_2$ (filler a), $CaTiO_3$ (filler b) and $ZrO_2$ (filler c) were prepared as fillers.

The glass powder used in Experiment 1—1 and the above fillers were weighed and mixed together at ratios shown in Table 6, followed by the addition of a solvent, and were then pulverized and mixed by using a ball mill. Thereafter, an organic binder and a plasticizer were added and mixed to a sufficient degree to prepare slurries from which green sheets having a thickness of 500 μm were prepared by the doctor blade method.

Samples measuring 50 mm×50 mm were cut out from the thus obtained green sheets, and from which the binder was removed at 750° C. in a nitrogen atmosphere containing water vapor. The samples were then fired at 910° C. in a nitrogen atmosphere to obtain ceramic sintered products (samples Nos. 1 to 43).

The obtained sintered products were measured for their porosities by the Archimedes' method and were measured for their coefficients of thermal expansion at 40 to 400° C., for their specific inductive capacities at 1 MHz and for their temperature coefficients (τε) of the specific inductive capacities at −40 to 100° C. The results were as shown in Table 6.

In Table 6, the amounts of the fillers a and b are shown as weight ratios to the sum of the fillers a and b. Further, the amount of the filler c is shown as a weight ratio to the sum of the fillers a to c. Table 6 also shows the sum of the fillers a and b as a weight ratio to the sum of the fillers a to c.

(Experiment 2—2)

$La_2O_3 \cdot 2TiO_2$ (filler a), $TiO_2$ (filler b) and $ZrO_2$ (filler c) were prepared as fillers.

The glass powder used in Experiment 1—1 and the above fillers were mixed together as shown in Table 7, and green sheets having at thickness of 500 μm were prepared in the same manner as in Experiment 2-1.

Samples measuring 50 mm×50 mm were cut out from the thus obtained green sheets, and from which the binder was removed at 700° C. in a nitrogen atmosphere containing water vapor. The samples were then fired at 910° C. in a nitrogen atmosphere to obtain ceramic sintered products (samples Nos. 44 to 72).

The obtained sintered products were evaluate din the same manner as in Experiment 2-1.

In Table 7, the amounts of the blended fillers are shown in the same manner as in Table 6.

(Experiment 2—3)

A glass powder (yield point of 657° C., coefficient of thermal expansion of $10.8 \times 10^{-6}$/° C., Pb amount of not larger than 50 ppm) comprising 29% by weight of $SiO_2$—55% by weight of BaO—7% by weight of $B_2O_3$—2% by weight of $Al_2O_3$—7% by weight of ZnO was prepared, and, besides, $La_2O_3 \cdot 2TiO_2$ (filler a), $SnTiO_3$ (filer b) and $ZrO_2$ (filler c) were prepared as fillers.

The above glass powder and the fillers were mixed together as shown in Table 8, and ceramic sintered products were obtained in the same manner as in Experiment 2-2 (samples Nos. 73 to 109).

The obtained sintered products were evaluated in the same manner as in Experiment 2-1.

In Table 8, the amounts of the blended fillers are shown in the same manner as in Table 6.

In Tables 6 to 8, the samples marked with * are those which did not exhibit good results.

TABLE 6

| Sample No. | Amount of glass (vol %) | Amount of filler (vol %) | Ratio of fillers ① a $La_2O_3 \cdot 2TiO_2$ | b $CaTiO_3$ | Ratio of fillers ② c $ZrO_2$ | a + b | Porosity (%) | Coefficient of thermal expansion | Specific inductive capacity | $\tau \epsilon$ $\times 10^{-6}$/° C. |
|---|---|---|---|---|---|---|---|---|---|---|
| 1* | 45 | 55 | 0.40 | 0.60 | 0.20 | 0.80 | 10.3 | — | — | — |
| 2* | 50 | 50 | 0.40 | 0.60 | — | 1.00 | 3.2 | — | — | — |
| 3 | 50 | 50 | 0.80 | 0.20 | 0.10 | 0.90 | ≦0.1 | 10.1 | 15.6 | −60 |
| 4 | 50 | 50 | 0.80 | 0.20 | 0.20 | 0.80 | ≦0.1 | 9.8 | 15.4 | −50 |
| 5 | 50 | 50 | 0.60 | 0.40 | 0.30 | 0.70 | ≦0.1 | 9.5 | 17.3 | −170 |
| 6 | 50 | 50 | 0.80 | 0.20 | 0.30 | 0.70 | ≦0.1 | 8.6 | 15.2 | −80 |
| 7* | 60 | 40 | — | 1.00 | — | 1.00 | ≦0.1 | 7.6 | 14.5 | −350 |
| 8 | 60 | 40 | 0.60 | 0.40 | — | 1.00 | ≦0.1 | 9.2 | 10.8 | −200 |
| 9* | 60 | 40 | — | 1.00 | 0.05 | 0.95 | ≦0.1 | 7.7 | 24.1 | −320 |
| 10 | 60 | 40 | 0.40 | 0.60 | 0.02 | 0.98 | ≦0.1 | 8.7 | 13.0 | −290 |
| 11 | 60 | 40 | 0.20 | 0.80 | 0.05 | 0.95 | ≦0.1 | 8.5 | 21.7 | −260 |
| 12 | 60 | 40 | 0.40 | 0.60 | 0.05 | 0.95 | ≦0.1 | 8.7 | 19.5 | −240 |
| 13 | 60 | 40 | 0.50 | 0.40 | 0.05 | 0.95 | ≦0.1 | 9.2 | 17.4 | −190 |
| 14 | 60 | 40 | 0.80 | 0.20 | 0.05 | 0.95 | ≦0.1 | 9.3 | 15.2 | −60 |
| 15 | 60 | 40 | 1.00 | — | 0.05 | 0.95 | ≦0.1 | 9.5 | 11.8 | 40 |
| 16* | 60 | 40 | — | 1.00 | 0.10 | 0.90 | ≦0.1 | 7.8 | 23.2 | −300 |
| 17 | 60 | 40 | 0.20 | 0.80 | 0.10 | 0.90 | ≦0.1 | 8.3 | 21.1 | −250 |
| 18 | 60 | 40 | 0.40 | 0.60 | 0.10 | 0.90 | ≦0.1 | 8.6 | 19.1 | −230 |
| 19 | 60 | 40 | 0.60 | 0.40 | 0.10 | 0.90 | ≦0.1 | 9.1 | 17.2 | −180 |
| 20 | 60 | 40 | 0.80 | 0.20 | 0.10 | 0.90 | ≦0.1 | 9.2 | 14.8 | −50 |
| 21* | 60 | 40 | 0.10 | 0.90 | 0.20 | 0.80 | ≦0.1 | 7.5 | 19.9 | −250 |
| 22 | 60 | 40 | 0.20 | 0.80 | 0.20 | 0.80 | ≦0.1 | 8.0 | 19.7 | −240 |
| 23 | 60 | 40 | 0.40 | 0.60 | 0.20 | 0.80 | ≦0.1 | 8.2 | 18.0 | −220 |
| 24 | 60 | 40 | 0.60 | 0.40 | 0.20 | 0.80 | ≦0.1 | 8.5 | 16.5 | −170 |
| 25 | 60 | 40 | 0.80 | 0.20 | 0.20 | 0.80 | ≦0.1 | 9.0 | 14.5 | −40 |
| 26 | 60 | 40 | 0.90 | 0.10 | 0.20 | 0.80 | ≦0.1 | 9.2 | 12.5 | −30 |
| 27 | 60 | 40 | 0.40 | 0.60 | 0.30 | 0.70 | ≦0.1 | 8.1 | 17.1 | −210 |
| 28 | 60 | 40 | 0.60 | 0.40 | 0.30 | 0.70 | ≦0.1 | 8.4 | 15.8 | −160 |
| 29 | 60 | 40 | 0.80 | 0.20 | 0.30 | 0.70 | ≦0.1 | 8.5 | 14.3 | −30 |
| 30 | 60 | 40 | 1.00 | — | 0.30 | 0.70 | ≦0.1 | 8.6 | 11.5 | 50 |
| 31* | 60 | 40 | — | 1.00 | 0.40 | 0.80 | ≦0.1 | 7.4 | 18.6 | −330 |
| 32* | 60 | 40 | 0.40 | 0.60 | 0.40 | 0.80 | ≦0.1 | 7.6 | 16.2 | −200 |
| 33* | 60 | 40 | 1.00 | — | 0.40 | 0.80 | ≦0.1 | 7.9 | 11.4 | 60 |
| 34 | 70 | 30 | 0.20 | 0.80 | 0.05 | 0.95 | ≦0.1 | 8.0 | 16.0 | −250 |
| 35 | 70 | 30 | 0.40 | 0.60 | 0.05 | 0.95 | ≦0.1 | 8.2 | 14.8 | −220 |
| 36 | 70 | 30 | 0.60 | 0.40 | 0.05 | 0.95 | ≦0.1 | 8.4 | 14.5 | −170 |
| 37 | 70 | 30 | 0.80 | 0.20 | 0.05 | 0.95 | ≦0.1 | 8.5 | 14.1 | −40 |
| 38 | 70 | 30 | 0.20 | 0.80 | 0.10 | 0.90 | ≦0.1 | 8.0 | 15.5 | −240 |
| 39 | 70 | 30 | 0.40 | 0.60 | 0.10 | 0.90 | ≦0.1 | 8.1 | 14.5 | −210 |
| 40 | 70 | 30 | 0.60 | 0.40 | 0.10 | 0.90 | ≦0.1 | 8.3 | 14.1 | −160 |
| 41 | 70 | 30 | 0.40 | 0.60 | 0.20 | 0.80 | ≦0.1 | 8.0 | 14.1 | −200 |
| 42* | 70 | 30 | 0.60 | 0.40 | 0.40 | 0.60 | ≦0.1 | 7.6 | 11.9 | −150 |
| 43* | 75 | 25 | 0.40 | 0.60 | 0.10 | 0.90 | ≦0.1 | 7.8 | 12.6 | −180 |

TABLE 7

| Sample No. | Amount of glass (vol %) | Amount of filler (vol %) | Ratio of fillers ① a La$_2$O$_3$·2TiO$_2$ | b CaTiO$_3$ | Ratio of fillers ② c ZrO$_2$ | a + b | Porosity (%) | Coefficient of thermal expansion | Specific inductive capacity | τ ε x10$^{-6}$/° C. |
|---|---|---|---|---|---|---|---|---|---|---|
| 44* | 45 | 55 | 0.40 | 0.60 | 0.20 | 0.80 | 9.4 | — | — | — |
| 45* | 50 | 50 | — | 1.00 | 0.05 | 0.95 | 5.3 | — | — | — |
| 46 | 50 | 50 | 0.80 | 0.20 | 0.10 | 0.90 | ≦0.1 | 10.0 | 15.2 | −30 |
| 47 | 50 | 50 | 0.80 | 0.20 | 0.20 | 0.80 | ≦0.1 | 9.8 | 15.0 | −20 |
| 48 | 50 | 50 | 0.60 | 0.40 | 0.30 | 0.70 | ≦0.1 | 9.4 | 16.9 | −80 |
| 49 | 50 | 50 | 0.80 | 0.20 | 0.30 | 0.70 | ≦0.1 | 9.5 | 14.8 | −40 |
| 50* | 60 | 40 | — | 1.00 | — | 1.00 | ≦0.1 | 7.6 | 14.2 | −170 |
| 51 | 60 | 40 | 0.60 | 0.40 | — | 1.00 | ≦0.1 | 9.1 | 10.7 | −100 |
| 52* | 60 | 40 | — | 1.00 | 0.05 | 0.95 | ≦0.1 | 7.5 | 23.8 | −160 |
| 53* | 60 | 40 | 0.10 | 0.90 | 0.05 | 0.95 | ≦0.1 | 7.7 | 22.1 | −150 |
| 54 | 60 | 40 | 0.20 | 0.80 | 0.02 | 0.98 | ≦0.1 | 8.4 | 13.8 | −140 |
| 55 | 60 | 40 | 0.20 | 0.80 | 0.05 | 0.95 | ≦0.1 | 8.3 | 21.5 | −130 |
| 56 | 60 | 40 | 0.40 | 0.60 | 0.05 | 0.95 | ≦0.1 | 8.5 | 19.3 | −120 |
| 57 | 60 | 40 | 0.60 | 0.40 | 0.05 | 0.95 | ≦0.1 | 9.1 | 17.3 | −90 |
| 58 | 60 | 40 | 0.90 | 0.10 | 0.05 | 0.95 | ≦0.1 | 9.4 | 13.7 | −30 |
| 59 | 60 | 40 | 0.80 | 0.20 | 0.05 | 0.95 | ≦0.1 | 9.2 | 15.2 | −30 |
| 60 | 60 | 40 | 0.20 | 0.80 | 0.10 | 0.90 | ≦0.1 | 8.1 | 20.9 | −130 |
| 61 | 60 | 40 | 0.40 | 0.60 | 0.10 | 0.90 | ≦0.1 | 8.4 | 18.9 | −110 |
| 62 | 60 | 40 | 0.60 | 0.40 | 0.10 | 0.90 | ≦0.1 | 9.0 | 17.1 | −90 |
| 63 | 60 | 40 | 0.80 | 0.20 | 0.10 | 0.90 | ≦0.1 | 9.1 | 14.7 | −20 |
| 64 | 60 | 40 | 0.40 | 0.60 | 0.20 | 0.80 | ≦0.1 | 8.0 | 17.8 | −110 |
| 65 | 60 | 40 | 0.60 | 0.40 | 0.20 | 0.80 | ≦0.1 | 8.4 | 16.4 | −80 |
| 66 | 60 | 40 | 0.80 | 0.20 | 0.20 | 0.80 | ≦0.1 | 8.9 | 14.4 | −20 |
| 67 | 60 | 40 | 0.60 | 0.40 | 0.30 | 0.70 | ≦0.1 | 8.3 | 15.7 | −80 |
| 68 | 60 | 40 | 0.80 | 0.20 | 0.30 | 0.70 | ≦0.1 | 8.4 | 14.2 | −10 |
| 69* | 60 | 40 | 0.60 | 0.40 | 0.40 | 0.80 | ≦0.1 | 7.6 | 15.0 | −70 |
| 70 | 70 | 30 | 0.40 | 0.60 | 0.05 | 0.95 | ≦0.1 | 8.2 | 14.2 | −110 |
| 71 | 70 | 30 | 0.60 | 0.40 | 0.05 | 0.95 | ≦0.1 | 8.3 | 14.2 | −80 |
| 72* | 75 | 25 | 0.40 | 0.60 | 0.05 | 0.95 | ≦0.1 | 7.7 | 12.3 | −70 |

TABLE 8

| Sample No. | Amount of glass (vol %) | Amount of filler (vol %) | Ratio of fillers ① a La$_2$O$_3$·2TiO$_2$ | b CaTiO$_3$ | Ratio of fillers ② c ZrO$_2$ | a + b | Porosity (%) | Coefficient of thermal expansion | Specific inductive capacity | τ ε x10$^{-6}$/° C. |
|---|---|---|---|---|---|---|---|---|---|---|
| 73* | 45 | 55 | 0.40 | 0.60 | 0.30 | 0.70 | 9.7 | — | — | — |
| 74* | 50 | 50 | 0.40 | 0.60 | — | 1.00 | 2.2 | — | — | — |
| 75* | 50 | 50 | — | 1.00 | 0.05 | 0.95 | 3.1 | — | — | — |
| 76 | 50 | 50 | 0.80 | 0.20 | 0.10 | 0.90 | ≦0.1 | 11.2 | 15.8 | −90 |
| 77 | 50 | 50 | 0.80 | 0.20 | 0.20 | 0.80 | ≦0.1 | 10.9 | 15.6 | −90 |
| 78 | 50 | 50 | 0.60 | 0.40 | 0.30 | 0.70 | ≦0.1 | 10.2 | 17.7 | −200 |
| 79 | 50 | 50 | 0.80 | 0.20 | 0.30 | 0.70 | ≦0.1 | 10.3 | 15.4 | −100 |
| 80 | 50 | 50 | 0.40 | 0.60 | 0.40 | 0.60 | ≦0.1 | 9.5 | 14.5 | −210 |
| 81* | 60 | 40 | — | 1.00 | — | 1.00 | ≦0.1 | 7.7 | 15.5 | −400 |
| 82 | 60 | 40 | 0.40 | 0.60 | — | 1.00 | ≦0.1 | 9.2 | 11.9 | −300 |
| 83 | 60 | 40 | 0.60 | 0.40 | — | 1.00 | ≦0.1 | 10.1 | 11.2 | −250 |
| 84 | 60 | 40 | 0.60 | 0.40 | 0.03 | 0.97 | ≦0.1 | 9.8 | 12.5 | −90 |
| 85 | 60 | 40 | 0.20 | 0.80 | 0.05 | 0.95 | ≦0.1 | 9.3 | 22.5 | −290 |
| 86 | 63 | 40 | 0.40 | 0.60 | 0.05 | 0.95 | ≦0.1 | 9.6 | 20.1 | −260 |
| 87 | 60 | 40 | 0.60 | 0.40 | 0.05 | 0.95 | ≦0.1 | 10.1 | 14.8 | −220 |
| 88 | 60 | 40 | 0.80 | 0.20 | 0.05 | 0.95 | ≦0.1 | 10.3 | 15.4 | −80 |
| 89* | 60 | 40 | 0.10 | 0.90 | 0.10 | 0.90 | ≦0.1 | 7.8 | 23.0 | −280 |
| 90 | 60 | 40 | 0.20 | 0.80 | 0.10 | 0.90 | ≦0.1 | 8.9 | 21.9 | −270 |
| 91 | 60 | 40 | 0.40 | 0.60 | 0.10 | 0.90 | ≦0.1 | 9.2 | 20.5 | −250 |
| 92 | 60 | 40 | 0.60 | 0.40 | 0.10 | 0.90 | ≦0.1 | 9.9 | 17.6 | −200 |
| 93 | 60 | 40 | 0.80 | 0.20 | 0.10 | 0.90 | ≦0.1 | 10.1 | 15.0 | −70 |
| 94 | 60 | 40 | 0.90 | 0.10 | 0.10 | 0.90 | ≦0.1 | 10.0 | 13.8 | −60 |
| 95 | 60 | 40 | 0.40 | 0.60 | 0.20 | 0.80 | ≦0.1 | 9.2 | 18.6 | −240 |
| 96 | 60 | 40 | 0.60 | 0.40 | 0.20 | 0.80 | ≦0.1 | 9.3 | 16.9 | −200 |
| 97 | 60 | 40 | 0.80 | 0.20 | 0.20 | 0.80 | ≦0.1 | 9.8 | 14.7 | −70 |
| 98 | 60 | 40 | 1.00 | — | 0.20 | 0.80 | ≦0.1 | 9.9 | 11.5 | −30 |
| 99* | 60 | 40 | — | 1.00 | 0.30 | 0.70 | ≦0.1 | 7.7 | 21.0 | −350 |
| 100 | 60 | 40 | 0.40 | 0.60 | 0.30 | 0.70 | ≦0.1 | 9.0 | 17.7 | −220 |
| 101 | 60 | 40 | 0.60 | 0.40 | 0.30 | 0.70 | ≦0.1 | 9.2 | 16.2 | −180 |

TABLE 8-continued

| Sample No. | Amount of glass (vol %) | Amount of filler (vol %) | Ratio of fillers ① a $La_2O_3.2TiO_2$ | b $CaTiO_3$ | Ratio of fillers ② c $ZrO_2$ | a + b | Porosity (%) | Coefficient of thermal expansion | Specific inductive capacity | τ ε x$10^{-6}$/° C. |
|---|---|---|---|---|---|---|---|---|---|---|
| 102 | 60 | 40 | 0.80 | 0.20 | 0.30 | 0.70 | ≦0.1 | 9.4 | 14.5 | −50 |
| 103* | 60 | 40 | 0.40 | 0.60 | 0.40 | 0.80 | ≦0.1 | 7.7 | 16.8 | −230 |
| 104 | 70 | 30 | 0.40 | 0.60 | 0.05 | 0.95 | ≦0.1 | 8.9 | 15.4 | −240 |
| 105 | 70 | 30 | 0.60 | 0.40 | 0.05 | 0.95 | ≦0.1 | 9.2 | 14.9 | −190 |
| 106 | 70 | 30 | 0.80 | 0.20 | 0.05 | 0.95 | ≦0.1 | 9.4 | 14.3 | −60 |
| 107 | 70 | 30 | 0.40 | 0.60 | 0.10 | 0.90 | ≦0.1 | 9.0 | 15.1 | −60 |
| 108 | 70 | 30 | 0.60 | 0.40 | 0.10 | 0.90 | ≦0.1 | 9.2 | 14.5 | −60 |
| 109* | 75 | 25 | 0.40 | 0.60 | 0.05 | 0.95 | ≦0.1 | 8.5 | 12.5 | −60 |

It will be learned from Tables 6 to 8 that the densely sintered products are not obtained at desired firing temperatures when the amount of the glass is small, but the densely sintered products are obtained by the addition of $La_2O_3.2TiO_2$ and $ZrO_2$.

When the ratio of $La_2O_3.2TiO_2$ in the filler is small, the coefficient of thermal expansion is small and when the ratio of $La_2O_3.2TiO_2$ is large in the filler, the specific inductive capacity is low and desired properties are not obtained. As the ratio of $ZrO_2$ in the filler increases, further, the coefficient of thermal expansion decreases and the specific inductive capacity decreases, too. Further, the sintering property is improved as the amount of the glass becomes as large as 70% by volume. As the ratio of $La_2O_3.2TiO_2$ and $ZrO_2$ increases, however, the components are partly eluted out and react with the jig for firing.

When $La_2O_3.2TiO_2$ is not used as the filler, further, it is difficult to increase the coefficient of thermal expansion to be not smaller than $9\times10^{-6}$/° C. When $La_2O_3.2TiO_2$ and a Zr compound are used in combination, it is possible to obtain a specific inductive capacity of not smaller than 10 and a thermal expansion which is as high as $9\times10^{-6}$/° C. or more, but it is difficult to increase the specific inductive capacity to be not smaller than 14 while maintaining a high density. When no Zr compound is added, it is difficult to increase the specific inductive capacity to be not smaller than 14 while maintaining a high density.

(Experiment 3-1)

$La_2O_3.2TiO_2$ (filler a), $CaTiO_3$ (filler b), $ZrO_2$ (filler c) and $MgTiO_3$ (filler d) were prepared as fillers.

The glass powder used in Experiment 1—1 and the above fillers were used at ratios shown in Table 9, and from which the sample sheets (having a thickness of 500 μm) measuring 50 mm×50 mm were prepared in the same manner as in Experiment 1—1. From the sample sheets was removed the binder at 750° C. in a nitrogen atmosphere containing water vapor. The sample sheets were then fired at 910° C. in a nitrogen atmosphere to obtain ceramic sintered products (samples Nos. 1 to 19).

The obtained sintered products were measured for their porosities, coefficients of thermal expansion, specific inductive capacities and tan δ in the same manner as in Experiment 1—1. The results were as shown in Table 9.

In Table 9, the amount of the filler d ($MgTiO_3$) is shown as a weight ratio to the sum of the fillers a and d. Further, the amount of the fillers a, b and d, and the amount of the filler c is shown as a weight ratio to the sum of the fillers a to d.

(Experiment 3-2)

$La_2O_3.2TiO_2$ (filler a), $TiO_2$ (filler b), $ZrO_2$ (filler c) and $MgTiO_3$ (filler d) were prepared as fillers.

The glass powder used in Experiment 1—1 and the above fillers were used at ratios shown in Table 10, and from which the sample sheets (having a thickness of 500 μm) measuring 50 mm×50 mm were prepared in the same manner as in Experiment 1—1. From the sample sheets was removed the binder at 700° C. in a nitrogen atmosphere containing water vapor. The sample sheets were then fired at 910° C. in a nitrogen atmosphere to obtain ceramic sintered products (samples Nos. 20 to 27).

The obtained sintered products were evaluated in the same manner as in Experiment 3-1. The results were as shown in Table 10.

(Experiment 3—3)

$La_2O_3.2TiO_2$ (filler a), $SrTiO_3$ (filer b), $ZrO_2$ (filler c) and $MgTiO_3$ (filler d) were prepared as fillers.

The glass powder used in Experiment 2–3 and the above fillers were then used at ratios shown in Table 11, and from which the ceramic sintered products (samples Nos. 28 to 35) were obtained in the same manner as in Experiment 3-2.

The obtained sintered products were evaluated in the same manner as in Experiment 3-1. The results were as shown in Table 11.

TABLE 9

| Sample No. | Amount of glass (vol %) | Amount of filler (vol %) | Blending ratio of fillers d/(a + d) | b/(a + b + d) | c/(a + b + c + d) | Porosity (%) | Coefficient of thermal expansion ($10^{-6}$/° C.) | Specific inductive capacity | tan δ ($10^{-4}$) |
|---|---|---|---|---|---|---|---|---|---|
| 1 | 50 | 50 | 0 | 0.2 | 0.1 | ≦0.1 | 10.1 | 14.9 | 37 |
| 2 | 50 | 50 | 0.2 | 0.2 | 0 | 2.5 | — | — | — |
| 3 | 50 | 50 | 0.2 | 0.2 | 0.1 | ≦0.1 | 9.6 | 14.3 | 23 |
| 4 | 60 | 40 | 0.3 | 0.5 | 0.1 | ≦0.1 | 8.9 | 19.2 | 24 |
| 5 | 60 | 40 | 0.5 | 0.2 | 0.1 | ≦0.1 | 9.1 | 14.5 | 19 |
| 6 | 60 | 40 | 0.5 | 0.3 | 0.1 | ≦0.1 | 9 | 17.6 | 20 |

TABLE 9-continued

| Sample No. | Amount of glass (vol %) | Amount of filler (vol %) | Blending ratio of fillers d/(a + d) | b/(a + b + d) | c/(a + b + c + d) | Porosity (%) | Coefficient of thermal expansion ($10^{-6}/°C.$) | Specific inductive capacity | tan δ ($10^{-4}$) |
| --- | --- | --- | --- | --- | --- | --- | --- | --- | --- |
| 7  | 60 | 40 | 0.5 | 0.4 | 0.1  | ≦0.1 | 8.9 | 18.1 | 22 |
| 8  | 60 | 40 | 0.5 | 0.5 | 0.01 | ≦0.1 | 9.3 | 13.9 | 46 |
| 9  | 60 | 40 | 0.5 | 0.5 | 0.05 | ≦0.1 | 9.1 | 16.8 | 24 |
| 10 | 60 | 40 | 0.5 | 0.5 | 0.1  | ≦0.1 | 8.8 | 18.8 | 22 |
| 11 | 60 | 40 | 0.5 | 0.5 | 0.3  | ≦0.1 | 8.2 | 14.3 | 22 |
| 12 | 60 | 40 | 0.5 | 0.5 | 0.5  | ≦0.1 | 7.4 | 10.7 | 35 |
| 13 | 60 | 40 | 0.5 | 0.6 | 0.1  | ≦0.1 | 8.8 | 19.2 | 23 |
| 14 | 60 | 40 | 0.5 | 0.7 | 0.1  | ≦0.1 | 8.7 | 19.7 | 24 |
| 15 | 60 | 40 | 0.5 | 0.8 | 0.1  | ≦0.1 | 8.6 | 20.1 | 24 |
| 16 | 60 | 40 | 0.7 | 0.5 | 0.1  | ≦0.1 | 8.3 | 16.5 | 22 |
| 17 | 70 | 30 | 0.8 | 0.8 | 0.1  | ≦0.1 | 8.1 | 14.1 | 25 |
| 18 | 70 | 30 | 0   | 1   | 0.2  | ≦0.1 | 7.8 | 18.9 | 40 |
| 19 | 70 | 30 | 1   | 0.8 | 0.1  | ≦0.1 | 7.9 | 14.2 | 29 |

Filler a: $La_2O_3 \cdot 2TiO_2$
Filler b: $CaTiO_3$
Filler c: $ZrO_2$
Filler d: $MgTiO_3$

TABLE 10

| Sample No. | Amount of glass (vol %) | Amount of filler (vol %) | Blending ratio of fillers d/(a + d) | b/(a + b + d) | c/(a + b + c + d) | Porosity (%) | Coefficient of thermal expansion ($10^{-6}/°C.$) | Specific inductive capacity | tan δ ($10^{-4}$) |
| --- | --- | --- | --- | --- | --- | --- | --- | --- | --- |
| 20 | 50 | 50 | 0   | 0.2 | 0.1 | ≦0.1 | 9.8 | 14.2 | 37 |
| 21 | 60 | 40 | 0.3 | 0.5 | 0.1 | ≦0.1 | 8.2 | 16.3 | 25 |
| 22 | 60 | 40 | 0.5 | 0.3 | 0.1 | ≦0.1 | 8.6 | 14.6 | 22 |
| 23 | 60 | 40 | 0.5 | 0.4 | 0.1 | ≦0.1 | 8.3 | 15.5 | 23 |
| 24 | 60 | 40 | 0.5 | 0.5 | 0.1 | ≦0.1 | 8.1 | 15.9 | 24 |
| 25 | 60 | 40 | 0.5 | 0.6 | 0.1 | ≦0.1 | 8   | 16.9 | 25 |
| 26 | 70 | 30 | 0   | 1   | 0.1 | ≦0.1 | 7.1 | 16.4 | 42 |
| 27 | 70 | 30 | 1   | 0.8 | 0.1 | ≦0.1 | 7.3 | 13.5 | 31 |

Filler a: $La_2O_3 \cdot 2TiO_2$
Filler b: $CaTiO_3$
Filler c: $ZrO_2$
Filler d: $MgTiO_3$

TABLE 11

| Sample No. | Amount of glass (vol %) | Amount of filler (vol %) | Blending ratio of fillers d/(a + d) | b/(a + b + d) | c/(a + b + c + d) | Porosity (%) | Coefficient of thermal expansion ($10^{-6}/°C.$) | Specific inductive capacity | tan δ ($10^{-4}$) |
| --- | --- | --- | --- | --- | --- | --- | --- | --- | --- |
| 28 | 50 | 50 | 0   | 0.2 | 0.1 | ≦0.1 | 11  | 15.6 | 40 |
| 29 | 60 | 40 | 0.3 | 0.5 | 0.1 | ≦0.1 | 9.3 | 17.5 | 25 |
| 30 | 60 | 40 | 0.5 | 0.3 | 0.1 | ≦0.1 | 9.6 | 15.8 | 23 |
| 31 | 60 | 40 | 0.5 | 0.4 | 0.1 | ≦0.1 | 9.4 | 16.6 | 23 |
| 32 | 60 | 40 | 0.5 | 0.5 | 0.1 | ≦0.1 | 9.2 | 16.9 | 25 |
| 33 | 60 | 40 | 0.5 | 0.6 | 0.1 | ≦0.1 | 9.1 | 18   | 25 |
| 34 | 70 | 30 | 0   | 1   | 0.1 | ≦0.1 | 8.3 | 17.5 | 51 |
| 35 | 70 | 30 | 1   | 0.8 | 0.1 | ≦0.1 | 8.4 | 14.4 | 42 |

Filler a: $La_2O_3 \cdot 2TiO_2$
Filler b: $CaTiO_3$
Filler c: $ZrO_2$
Filler d: $MgTiO_3$ It will be learned from the results of Tables 9 to 11 that the tan δ is decreased by the addition of the magnesium titanate (filler d) as a filler.

When the amount of addition of magnesium titanate increases, on the other hand, the coefficient of thermal expansion decreases and the sintering property becomes poor. Therefore, the amount of the glass component must be increased resulting, however, in a decrease in the specific inductive capacity. Upon adjusting the ratios of addition of the filler b (calcium titanate, strontium titanate, titania, etc.) and the filler c ($ZrO_2$) used in combination with the filler a(lanthanum titanate) depending upon the amount of addition of the magnesium titanate, therefore, the coefficient of thermal expansion can be increased to be not smaller than $8 \times 10^{-6}/°$ C., the specific inductive capacity can be increased to be not smaller than 14, and the tan ∂ can be suppressed to be not larger than 25.

(Experiment 4-1)

A glass shown in Table 12 was prepared as a glass powder containing an alkaline earth metal oxide and $SiO_2$. In Table 12, the coefficients of thermal expansion are the coefficients of linear expansion at 40 to 400° C.

The obtained sintered products were measured for their coefficients of thermal expansion at 40 to 400° C., specific inductive capacities at 3 GHz and tan δ.

Next, the thus obtained sintered products were melted with an alkali by using sodium carbonate, and the melts were dissolved in a hydrochloric acid solution. Ca, Ba, Si and Zr in the solution were analyzed by using an ICP light-emitting spectral analyzer, and the alkaline earth oxides, $SiO_2$ and $ZrO_2$ in the glass phase were quantitatively evaluated from the obtained data.

The thus obtained sintered products were identified for their crystal phases by the X-ray analysis by using a copper target, the peak intensities of the crystal phases were compared to find a ratio $I/I_0$, wherein "I" is a maximum peak intensity of detected composite oxides containing an alkaline earth metal element and Si [maximum peak intensity among $CaTiSiO_5$ (CTS), $Ba_2TiSi_2O_8$ (B2TS2), $BaAl_2Si_2O_8$ (BAS2)], and "$I_0$" is a maximum intensity of the detected oxides containing Ti [maximum peak intensity among CTS, B2TS2]. The evaluated results were as shown in Table 14.

TABLE 12

| | Glass composition (weight ratio) | Yield point (° C.) | α × 10⁻⁶ (° C.) |
|---|---|---|---|
| ① | 43%SiO₂-37%BaO-9%B₂O₃-6%Al₂O₃-5%CaO | 700 | 7.0 |
| ② | 29%SiO₂-55%BaO-7%B₂O₃-2%Al₂O₃-7%ZnO | 657 | 10.8 |
| ③ | 48%SiO₂-23%BaO-10%B₂O₃-7%Al₂O₃-12%CaO | 702 | 8.3 |
| ④ | 43%SiO₂-31%BaO-9%B₂O₃-6%Al₂O₃-5%CaO-6%ZrO₂ | 726 | 6.2 |

Further $CaTiO_3$ (CT), $La_2O_3 \cdot 2TiO_2$ (TLT) and $ZrO_2$ (ZR) were prepared as filler powders.

The glass powder shown in Table 12 and the above filler powders were weighed and mixed at ratios shown in Table 13, followed by the addition of a solvent, and were then pulverized and mixed by suing a ball mill. Thereafter, an organic binder and a plasticizer were added and mixed to a sufficient degree to prepare slurries from which green sheets having a thickness of 500 μm were prepared by the doctor blade method.

Samples measuring 50 mm×50 mm were prepared from the thus obtained green sheets, and from which the binder was removed at 750° C. in a nitrogen atmosphere containing water vapor. The samples were then fired at temperatures shown in Table 13 in a nitrogen atmosphere to obtain sintered products (samples Nos. 1 to 14).

TABLE 13

| Sample No. | Composition ratio (vol %) | | | | Firing temperature (° C.) |
|---|---|---|---|---|---|
| | Glass | CT | TLT | ZR | |
| 1 | ① 60 | 8.5 | 27.5 | 4 | 920 |
| 2 | ① 60 | 9 | 29 | 2 | 920 |
| 3 | ① 60 | 14 | 22 | 4 | 920 |
| 4 | ① 60 | 14 | 24 | 2 | 920 |
| 5 | ① 60 | 16 | 16 | 8 | 920 |
| 6 | ① 60 | 18 | 18 | 4 | 920 |
| 7 | ① 60 | 18 | 20 | 2 | 920 |
| 8 | ① 60 | 22.7 | 13.9 | 4 | 940 |
| 9 | ① 60 | 24 | 14 | 2 | 920 |
| 10 | ② 65 | 15.75 | 15.75 | 3.5 | 940 |
| 11 | ③ 65 | 5.75 | 25.75 | 3.5 | 920 |
| 12 | ③ 65 | 15.75 | 15.75 | 3.5 | 920 |
| 13 | ④ 65 | 5.75 | 29.25 | 0 | 920 |
| 14 | ④ 65 | 15.75 | 15.75 | 3.5 | 920 |

TABLE 14

| Sample No. | α × 10⁻⁶ (° C.) 40–400° C. | εT 3 GHz | tan δ (10⁻⁴) 3 GHz | Glass phase (wt %) | | | | Crystal phase: max. peak intensity | | | | | I/Io |
|---|---|---|---|---|---|---|---|---|---|---|---|---|---|
| | | | | Alkaline earth metal | SiO₂ | ZrO₂ | CT | CTS | B2TS2 | BAS2 | TLT | | |
| 1 | 8.6 | 16.0 | 29 | 34 | 34 | 9 | 29 | 7 | | 16 | 48 | | 0.33 |
| 2 | 8.7 | 16.6 | 26 | 35 | 35 | 5 | 26 | 7 | 9 | 15 | 43 | | 0.36 |
| 3 | 8.4 | 17.8 | 26 | 35 | 35 | 9 | 35 | 9 | | 18 | 38 | | 0.49 |
| 4 | 8.7 | 17.9 | 27 | 35 | 34 | 5 | 29 | 10 | 13 | 17 | 31 | | 0.55 |
| 5 | 8.0 | 15.7 | 25 | 31 | 31 | 17 | 37 | 11 | | 23 | 29 | | 0.62 |
| 6 | 8.8 | 19.2 | 28 | 35 | 34 | 9 | 38 | 11 | | 20 | 31 | | 0.51 |
| 7 | 8.5 | 18.7 | 28 | 35 | 34 | 5 | 31 | 12 | 15 | 18 | 24 | | 0.60 |
| 8 | 8.7 | 17.7 | 27 | 32 | 31 | 9 | 37 | 19 | | 23 | 21 | | 0.63 |
| 9 | 8.6 | 18.7 | 29 | 32 | 30 | 5 | 23 | 19 | 21 | 21 | 16 | | 0.94 |
| 10* | 9.4 | 15.0 | 90 | 40 | 16 | 10 | | 5 | 68 | 19 | 8 | | 1.00 |

TABLE 14-continued

| Sample No. | $\alpha \times 10^{-6}$ (°C.) 40–400° C. | $\epsilon T$ 3 GHz | tan δ $(10^{-4})$ 3 GHz | Glass phase (wt %) Alkaline earth metal | SiO$_2$ | ZrO$_2$ | Crystal phase: max. peak intensity CT | CTS | B2TS2 | BAS2 | TLT | I/Io |
|---|---|---|---|---|---|---|---|---|---|---|---|---|
| 11 | 8.4 | 16.5 | 30 | 40 | 36 | 9 | 13 | 33 | | 19 | 35 | 0.94 |
| 12 | 8.2 | 17.7 | 29 | 36 | 33 | 8 | 17 | 34 | | 24 | 25 | 1.00 |
| 13 | 8.4 | 16.6 | 24 | 27 | 36 | 16 | 32 | 10 | | 17 | 41 | 0.42 |

Note)
CT = CaTiO$_3$,
CTS = CaTiSiO$_5$,
B2TS2 = Ba$_2$TiSi$_2$O$_8$,
BAS2 = BaAl$_2$Si$_2$O$_8$,
TLT = La$_2$O$_3$.2TiO$_2$ It will be learned from the experimental results of Table 14 that the amount of SiO$_2$ in the glass phase is small and the tan δ is high when the ratio I/I$_0$ of a maximum peak intensity I of the composite oxide (CaTiSiO$_5$, Ba$_2$TiSi$_2$O$_8$, BaAl$_2$Si$_2$O$_8$) containing an alkaline earth metal element and Si to a maximum peak intensity I$_0$ of the Ti-containing oxide [CaTiSiO$_5$, Ba$_2$TiSi$_2$O$_8$, La$_2$O$_3$.2TiO$_2$ (TLT)], is not smaller than 1, but when the ratio I/I$_0$ is smaller than 1, the amount of SiO$_2$ is large in the glass phase, the tan δ is suppressed to be not larger than $30 \times 10^{-4}$ yet exhibiting a coefficient of thermal expansion of not smaller than $8 \times 10^{-6}/°$ C. and a specific inductive capacity of not smaller than 14.

Experiment 5-1)

Quarts and forsterite were prepared as filler powders, and these filler powders and the glass powder used in Experiment 1—1 were mixed together at ratios shown in Table 15, followed by the addition of a solvent, and were then pulverized and mixed by using a ball mill. Thereafter, an organic binder and a plasticizer were added to prepare slurries from which green sheets having a thickness of 300 μm and small dielectric constants were prepared by the doctor blade method. Five pieces of the thus obtained green sheets were intimately adhered together to prepare samples measuring 50 mm×50 mm. From the samples was then removed the binder at 700° C. in a nitrogen atmosphere containing water vapor. The samples were then fired at a temperature of 910° C. in a nitrogen atmosphere to obtain sintered products having small dielectric constants.

The obtained sintered products were measured for their specific inductive capacities and coefficients of thermal expansion at 40 to 400° C. The results were as shown in Table 15. The sintered products having small dielectric constants were put to the X-ray diffraction measurement and from which were observed crystal phases of quartz and diopside.

A composition A (having a specific inductive capacity of 18.6 after sintering, and a coefficient of thermal expansion of 9.1 ppm/° C.) was prepared by adding 18% by volume of calcium titanate and 18% by volume of lanthanum titanate, as fillers, to 64% by volume of the above glass powder. By using this composition A, a green sheet having a thickness of 300 μm and a high dielectric constant was prepared by the same molding method as the one described above.

Then, electrode patterns of a copper paste were printed onto the upper and lower surfaces of the green sheet having a high dielectric constant that has been prepared was press-adhered thereto via an adhesive, followed by firing in a nitrogen atmosphere at 900° C. for 1 hour to obtain sample wiring boards (samples Nos. 1 to 17) having a layer constitution shown in FIG. 1.

Further, a composition B (having a specific inductive capacity of 12.8 after sintering, and a coefficient of thermal expansion of 10.2 ppm/° C.) was prepared by adding 14% by volume of calcium titanate, 14% by volume of lanthanum titanate and 20% by volume of quartz, as fillers, to 52% by volume of the above glass powder. By using this composition B, sample wiring boards (samples Nos. 18 to 34) having a layer constitution shown in FIG. 1 were obtained in quite the same manner as the one described above.

The thus obtained sample wiring boards (samples Nos. 1 to 34) were observed, by using a binocular microscope, for their interfacial states between the layer of a high dielectric constant formed of a sintered product having a high dielectric constant and a layer of a low dielectric constant formed of a sintered product having a low dielectric constant. Further, the samples were subjected to 500 heat cycles each cycle consisting of −65° C.×5 minutes and 150° C.×5 minutes, and their electrostatic capacities were measured to measure a change from the initial electrostatic capacities. The results were as shown in Table 15.

TABLE 15

| No. | High dielectric constant layer $\alpha \times 10^{-6}$ (°C.) | Low dielectric constant layer (vol %) Glass | Quartz | Forsterite | Characteristic of low dielectric constant layer Specific inductive capacity | $\alpha \times 10^{-6}$ (°C.) | Sintering with layer (note 1) | Eeat cycle properties (note 2) |
|---|---|---|---|---|---|---|---|---|
| 1 | A 9.1 | 55 | 0 | 45 | 7.1 | 7.95 | C | — |
| 2 | A 9.1 | 55 | 4.5 | 40.5 | 6.9 | 8.36 | B | X |
| 3 | A 9.1 | 55 | 9 | 36 | 6.6 | 8.76 | A | ○ |

TABLE 15-continued

| No. | High dielectric constant layer α × 10⁻⁶ (° C.) | Low dielectric constant layer (vol %) Glass | Quartz | Forsterite | Characteristic of low dielectric constant layer Specific inductive capacity | α × 10⁻⁶ (° C.) | Sintering with layer (note 1) | Eeat cycle properties (note 2) |
|---|---|---|---|---|---|---|---|---|
| 4 | A 9.1 | 55 | 13.5 | 31.5 | 6.5 | 9.19 | A | ○ |
| 5 | A 9.1 | 55 | 18 | 27 | 6.2 | 9.57 | A | ○ |
| 6 | A 9.1 | 55 | 22.5 | 22.5 | 6.2 | 10.04 | B | X |
| 7 | A 9.1 | 55 | 27 | 18 | 6 | 10.35 | C | — |
| 8 | A 9.1 | 55 | 31.5 | 13.5 | 5.9 | 10.69 | C | — |
| 9 | A 9.1 | 55 | 36 | 9 | 5.6 | 11.26 | C | — |
| 10 | A 9.1 | 55 | 40.5 | 4.5 | 5.5 | 11.64 | C | — |
| 11 | A 9.1 | 55 | 45 | 0 | 5.2 | 12.14 | C | — |
| 12 | A 9.1 | 60 | 0 | 40 | 6.9 | 7.9 | C | — |
| 13 | A 9.1 | 60 | 20 | 20 | 6.2 | 9.74 | B | X |
| 14 | A 9.1 | 60 | 40 | 0 | 5.4 | 11.5 | C | — |
| 15 | A 9.1 | 35 | 0 | 65 | 7.4 | 8.15 | B | X |
| 16 | A 9.1 | 35 | 32.5 | 32.5 | 6 | 11.04 | C | — |
| 17 | A 9.1 | 35 | 65 | 0 | 4.9 | 14 | C | — |
| 18 | B 10.2 | 55 | 0 | 45 | 7.1 | 7.95 | C | — |
| 19 | B 10.2 | 55 | 4.5 | 40.5 | 6.9 | 8.36 | C | — |
| 20 | B 10.2 | 55 | 9 | 36 | 6.6 | 8.76 | C | — |
| 21 | B 10.2 | 55 | 13.5 | 31.5 | 6.5 | 9.19 | B | X |
| 22 | B 10.2 | 55 | 18 | 27 | 6.2 | 9.57 | B | X |
| 23 | B 10.2 | 55 | 22.5 | 22.5 | 6.2 | 10.04 | A | ○ |
| 24 | B 10.2 | 55 | 27 | 18 | 6 | 10.35 | A | ○ |
| 25 | B 10.2 | 55 | 31.5 | 13.5 | 5.9 | 10.69 | A | ○ |
| 26 | B 10.2 | 55 | 36 | 9 | 5.6 | 11.26 | C | — |
| 27 | B 10.2 | 55 | 40.5 | 4.5 | 5.5 | 11.64 | C | — |
| 28 | B 10.2 | 55 | 45 | 0 | 5.2 | 12.14 | C | — |
| 29 | B 10.2 | 60 | 0 | 40 | 6.9 | 7.9 | C | — |
| 30 | B 10.2 | 60 | 20 | 20 | 5.2 | 9.74 | A | ○ |
| 31 | B 10.2 | 60 | 40 | 0 | 5.4 | 11.5 | C | — |
| 32 | B 10.2 | 35 | 0 | 65 | 7.4 | 8.15 | C | — |
| 33 | B 10.2 | 35 | 32.5 | 32.5 | 6 | 11.04 | B | X |
| 34 | B 10.2 | 35 | 65 | 0 | 4.9 | 14 | C | — |

(Note 1)
A: Dense product is obtained.
B: Local ceacks between layers.
C: Pealed or broken in the step of firing.
(Note 2)
○: Good (no change)
X: Changed From the experimental results shown in Table 15, when the quartz was used in small amounts and the forsterite was used in large amounts, the sintered products of low dielectric constants contained quartz in decreased amounts and contained diopside in increased amounts to exhibit decreased coefficients of thermal expansion. Further, when the quartz was used in large amounts and the forsterite in small amounts, the sintered products contained quartz in increased amounts and the diopside in decreased amounts to exhibit increased coefficients of thermal expansion.

The samples Nos. 12 to 14 having a glass mixing ratio of 60% by volume exhibited the same tendency, and were suited for being fired simultaneously with the glass ceramics of a high dielectric constant which yielded a favorable and dense product even at firing temperatures lower than those of the samples Nos. 1 to 13.

When the difference in the coefficient of thermal expansion between the layer of a high dielectric constant and the layer of a low dielectric constant was not smaller than 0.5 ppm/° C., layers were pealed off and cracks developed in the step of firing. When the layer of a high dielectric constant possessed a coefficient of thermal expansion which was larger than that of the layer of a low dielectric constant in particular, cracks developed in the layer of a high dielectric constant in the direction of thickness. When the difference in the coefficient of thermal expansion became larger than about 1 ppm/° C. the whole multi-layer wiring board was broken in the step of firing.

On the other hand, when the layer of a high dielectric constant possessed a coefficient of thermal expansion which was smaller than that of the layer of a low dielectric constant and the difference thereof was larger than 0.5 ppm/° C., cracks developed in the layer of a high dielectric constant in the horizontal direction. When the difference in the coefficient of thermal expansion was larger than about 1 ppm/° C., peeling took place in the layer of a high dielectric constant in the horizontal direction. From the above results, it was learned that the properties could be stabilized during the firing or even after the heat cycles by confining the difference in the coefficient of thermal expansion between the layer of a high dielectric constant and the layer of a low dielectric constant to be not larger than 0.5 ppm/° C.

What is claimed is:

1. A ceramic wiring board provided with an insulating layer of a high dielectric constant formed of a ceramic sintered product having a high dielectric constant wherein said ceramic sintered product contains a crystal phase of lanthanum titanate and a glass phase present on the grain boundaries of said crystal phase, and the ceramic sintered product has a coefficient of thermal expansion at 40 to 400°

C. of not smaller than $8\times10^{-6}/°$ C., a specific inductive capacity at 1 MHz of not smaller than 10, and a porosity of not more than 0.5%.

2. A ceramic wiring board according to claim 1, wherein said lanthanum titanate is expressed by the following formula,

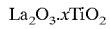

$$La_2O_3 \cdot xTiO_2$$

wherein x is a mol fraction satisfying $2 \leqq x \leqq 5$.

3. A ceramic wiring board according to claim 1, wherein said ceramic sintered product contains not leas than 10% by weight of a crystal phase of lanthanum titanate.

4. A ceramic wiring board according to claim 1, wherein said ceramic sintered product contains a crystal phase of a composite oxide that contains Ti and an alkaline earth metal.

5. A ceramic wiring board to claim 4, wherein said ceramic sintered product contains zirconium as a solid solution in said glass phase and/or in the crystal phase of the composite oxide containing Ti and the alkaline earth metal.

6. A ceramic wiring board according to claim 1, wherein said ceramic sintered product contains a crystal phase of a composite oxide that contains Si and an alkaline earth metal.

7. A ceramic wiring board provided with an insulating layer of a high dielectric constant formed of a ceramic sintered product having a high dielectric constant, wherein said ceramic sintered product contains a crystal phase of lanthanum titanate and a glass phase present on the grain boundaries of said crystal phase, and the ceramic sintered product has a coefficient of thermal expansion at 40 to 400° C. of not smaller than $8\times10^{-6}/°$ C., a specific inductive capacity at 1 MHz of not smaller than 10, and a porosity of not more than 0.5%, and wherein said ceramic sintered product is obtained by firing 35 to 70% by weight of a glass component and 30 to 65% by weight of a filler component that contains at least lanthanum titanate.

8. A ceramic wiring board according to claim 7, wherein said glass component has a coefficient of thermal expansion at 40 to 400° C. of 6 to $18\times10^{-6}/°$ C.

9. A ceramic wiring board according to claim 7, wherein said filler component comprises:

(a) lanthanum titanate;

(b) at least one titanium compound selected from the group consisting of calcium titanate, strontium titanate, barium titanate and titania; and (c) an oxide containing zirconium;

and said ceramic sintered product has a specific inductive capacity at 1 MHz of not smaller than 14.

10. A ceramic wiring board according to claim 9, wherein said filler component (b) is used in an amount of from 20 to 80% by weight per the sum of the filler components (a), and (b).

11. A ceramic wiring board according to claim 9, wherein said filler component (c) is used in an amount of from 5 to 30% by weight per the sum of the filler components (a), (b) and (c).

12. A ceramic wiring board according to claim 9, wherein said filler component further contains (d) magnesium titanate, and said ceramic sintered product has a specific inductive capacity at 1 MHz to 3 GHz of not smaller than 14 and a dielectric loss tangent (tan δ) at 1 MHz to 3 GHz of not larger than $25 \times 10^{-4}$.

13. A ceramic wiring board according to claim 12, wherein said filler component (d) is used in an amount of from 20 to 80 % by weight per the sum of the filler components (a) and (d).

14. A ceramic wiring board according to claim 13, wherein said filler component (b) is used in an amount of from 20 to 80% by weight per the sum of the filler components (a), (b) and (d), and said filler component (c) in an amount of from 5 to 30% by weight per the sum of the filler components (a) to (d).

15. A ceramic wiring board according to claim 7, wherein said glass component contains 15 to 40% by weight of an alkaline earth metal oxide, 30 to 60% by weight of $SiO_2$ and 1 to 20% by weight of $ZrO_2$, and said ceramic sintered product has a dielectric loss tangent (tan δ) at 1 MHz to 3 GHz of not larger than $30 \times 40^{-4}$.

16. A ceramic wiring board according to claim 15, wherein said ceramic sintered product has a peak intensity ratio $I/I_0$ of a maximum peak intensity I, as measured an X-ray diffraction measurement, is smaller than 1, wherein "I" means a maximum peak intensity of detected composite oxides containing alkaline earth metal and Si, and "$I_0$" means a maximum peak intensity of detected oxides containing Ti.

17. A ceramic wiring board provided with an insulating layer of a high dielectric constant formed of a ceramic sintered product having a high dielectric constant, wherein said ceramic sintered product contains a crystal phase of lanthanum titanate and a glass phase present on the grain boundaries of said crystal phase, and the ceramic sintered product has a coefficient of thermal expansion at 40 to 400° C. of not smaller than $8\times10^{-6}/°$ C., a specific inductive capacity at 1 MHz of not smaller than 10, and a porosity of not more than 0.5%, and wherein the ceramic wiring board comprises a laminate of the insulating layer of a high dielectric constant formed of said ceramic sintered product having a high dielectric constant and an insulating layer of a low dielectric constant formed of a ceramic sintered product having a low specific inductive capacity which is smaller than 10.

18. A ceramic wiring board according to claim 17, wherein said ceramic sintered product of a low dielectric constant has, as a crystal phase, quartz and a composite oxide crystal containing Si and Mg, and has a difference in the thermal expansion at 40 to 400° C. of not larger than 0.5 ppm/° C. between said insulating layer of a high dielectric constant and said insulating layer of a low dielectric constant.

19. A ceramic wiring board according to claim 18, wherein the composite oxide crystal containing Si and Mg is $MgSiO_3$ or $Mg_2SiO_5$.

20. A ceramic wiring board according to claim 1, wherein said insulating layer of a high dielectric constant is arranged between a pair of electrode layers.

* * * * *